(12) United States Patent
Kiyono et al.

(10) Patent No.: US 9,860,989 B2
(45) Date of Patent: Jan. 2, 2018

(54) ELECTRONIC COMPONENT MODULE AND METHOD FOR MANUFACTURING ELECTRONIC COMPONENT MODULE

(71) Applicant: MURATA MANUFACTURING CO., LTD., Kyoto-fu (JP)

(72) Inventors: Shinya Kiyono, Nagaokakyo (JP); Toshitaka Hayashi, Nagaokakyo (JP); Sho Fujita, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/225,379

(22) Filed: Aug. 1, 2016

(65) Prior Publication Data

US 2016/0338201 A1 Nov. 17, 2016

Related U.S. Application Data

(63) Continuation of application No. PCT/JP2015/052018.

(30) Foreign Application Priority Data

Feb. 4, 2014 (JP) .................................. 2014-019212

(51) Int. Cl.
*H05K 7/10* (2006.01)
*H05K 7/12* (2006.01)
(Continued)

(52) U.S. Cl.
CPC ........... *H05K 1/181* (2013.01); *B22F 1/0059* (2013.01); *B22F 7/064* (2013.01); *H01B 1/22* (2013.01);
(Continued)

(58) Field of Classification Search
CPC . H01L 2924/00014; H01L 2924/01029; H01L 2924/01046; H01L 2924/0541;
(Continued)

(56) References Cited

U.S. PATENT DOCUMENTS 4,859,364 A * 8/1989 Yamamoto ............ B22F 1/0003
252/512
5,180,523 A * 1/1993 Durand .................. C09J 163/00
252/512

(Continued)

FOREIGN PATENT DOCUMENTS

EP 2 923 781 A1 9/2015
EP 3 188 314 A1 7/2017

(Continued)

OTHER PUBLICATIONS

International Search Report issued in PCT/JP2015/052018; dated Apr. 21, 2015.

(Continued)

*Primary Examiner* — Yuriy Semenenko
(74) *Attorney, Agent, or Firm* — Studebaker & Brackett PC

(57) ABSTRACT

An electronic component module formed with the use of a copper particle paste which can ensure that even the inner part of a joint material is sintered, where copper particles are excellent in oxidation resistance, and a joint part is provided with high joint reliability; and a method for manufacturing the module.

9 Claims, 11 Drawing Sheets

(51) Int. Cl.
| | |
|---|---|
| H05K 1/18 | (2006.01) |
| H01B 1/22 | (2006.01) |
| H01L 23/00 | (2006.01) |
| H05K 3/32 | (2006.01) |
| B22F 1/00 | (2006.01) |
| B22F 7/06 | (2006.01) |
| H05K 1/09 | (2006.01) |
| H01L 23/31 | (2006.01) |
| B23K 35/30 | (2006.01) |
| B23K 35/02 | (2006.01) |

(52) U.S. Cl.
CPC ............ *H01L 24/13* (2013.01); *H01L 24/17* (2013.01); *H01L 24/29* (2013.01); *H01L 24/81* (2013.01); *H01L 24/83* (2013.01); *H05K 1/097* (2013.01); *H05K 3/32* (2013.01); *B23K 35/025* (2013.01); *B23K 35/302* (2013.01); H01L 23/3121 (2013.01); H01L 24/16 (2013.01); H01L 24/27 (2013.01); H01L 24/32 (2013.01); H01L 2224/13139 (2013.01); H01L 2224/13144 (2013.01); H01L 2224/13147 (2013.01); H01L 2224/13155 (2013.01); H01L 2224/13164 (2013.01); H01L 2224/13194 (2013.01); H01L 2224/13347 (2013.01); H01L 2224/13487 (2013.01); H01L 2224/16227 (2013.01); H01L 2224/16501 (2013.01); H01L 2224/2732 (2013.01); H01L 2224/2939 (2013.01); H01L 2224/29294 (2013.01); H01L 2224/29347 (2013.01); H01L 2224/29487 (2013.01); H01L 2224/81075 (2013.01); H01L 2224/8184 (2013.01); H01L 2224/81193 (2013.01); H01L 2224/81359 (2013.01); H01L 2224/81439 (2013.01); H01L 2224/81444 (2013.01); H01L 2224/81447 (2013.01); H01L 2224/81455 (2013.01); H01L 2224/83075 (2013.01); H01L 2224/8384 (2013.01); H01L 2924/12044 (2013.01); H05K 2201/0257 (2013.01); H05K 2201/10015 (2013.01); H05K 2203/1131 (2013.01)

(58) Field of Classification Search
CPC . H01L 2224/13139; H01L 2224/13144; H01L 2224/13147; H01L 2224/13155; H01L 2224/13164; H01L 2224/13347; H01L 2224/13487
See application file for complete search history.

(56) References Cited

U.S. PATENT DOCUMENTS

| | | | | |
|---|---|---|---|---|
| 5,652,042 | A * | 7/1997 | Kawakita | H01B 1/22 252/511 |
| 6,139,777 | A * | 10/2000 | Omoya | H05K 1/095 156/306.3 |
| 6,479,763 | B1 * | 11/2002 | Igaki | C09J 9/02 174/260 |
| 6,679,937 | B1 | 1/2004 | Kodas et al. | |
| 8,092,696 | B2 * | 1/2012 | Nakamura | H05K 3/108 174/255 |
| 9,309,119 | B2 * | 4/2016 | Hayashi | B22F 1/0014 |
| 9,603,295 | B2 * | 3/2017 | Yamaguchi | H01L 24/16 |
| 2001/0003362 | A1 * | 6/2001 | Sano | B22F 1/0014 252/512 |
| 2003/0122257 | A1 * | 7/2003 | Onami | H01B 1/22 257/762 |
| 2007/0018140 | A1 * | 1/2007 | Lee | B22F 1/0018 252/500 |
| 2011/0233480 | A1 | 9/2011 | Hayashi et al. | |

FOREIGN PATENT DOCUMENTS

| | | |
|---|---|---|
| JP | 2002-110444 A | 4/2002 |
| JP | 2004-265607 A | 9/2004 |
| JP | 2006-019522 A | 1/2006 |
| JP | 2008-031491 A | 2/2008 |
| JP | 2011-202208 A | 10/2011 |
| JP | 2011-219862 A | 11/2011 |
| JP | 2012-038790 A | 2/2012 |
| JP | 2012-099384 A | 5/2012 |
| JP | 2013-008907 A | 1/2013 |
| JP | 2013-091835 A | 5/2013 |

OTHER PUBLICATIONS

Written Opinion issued in PCT/JP2015/052018; dated Apr. 21, 2015.

An Office Action; "Notice of Reasons for Rejection," issued by the Japanese Patent Office on Oct. 24, 2017, which corresponds to Japanese Patent Application No. 2015-560928 and is related to U.S. Appl. No. 15/225,379.

The extended European search report issued by the European Patent Office on Oct. 13, 2017, which corresponds to EP15746474.4-1373 and is related to U.S. Appl. No. 15/225,379.

Halaciuga et al.; Method for preparing dispersed crystalline copper particles for electronic applications; Journal of Materials Research; Oct. 2009; pp. 3237-3240; vol. 24, No. 10.

* cited by examiner

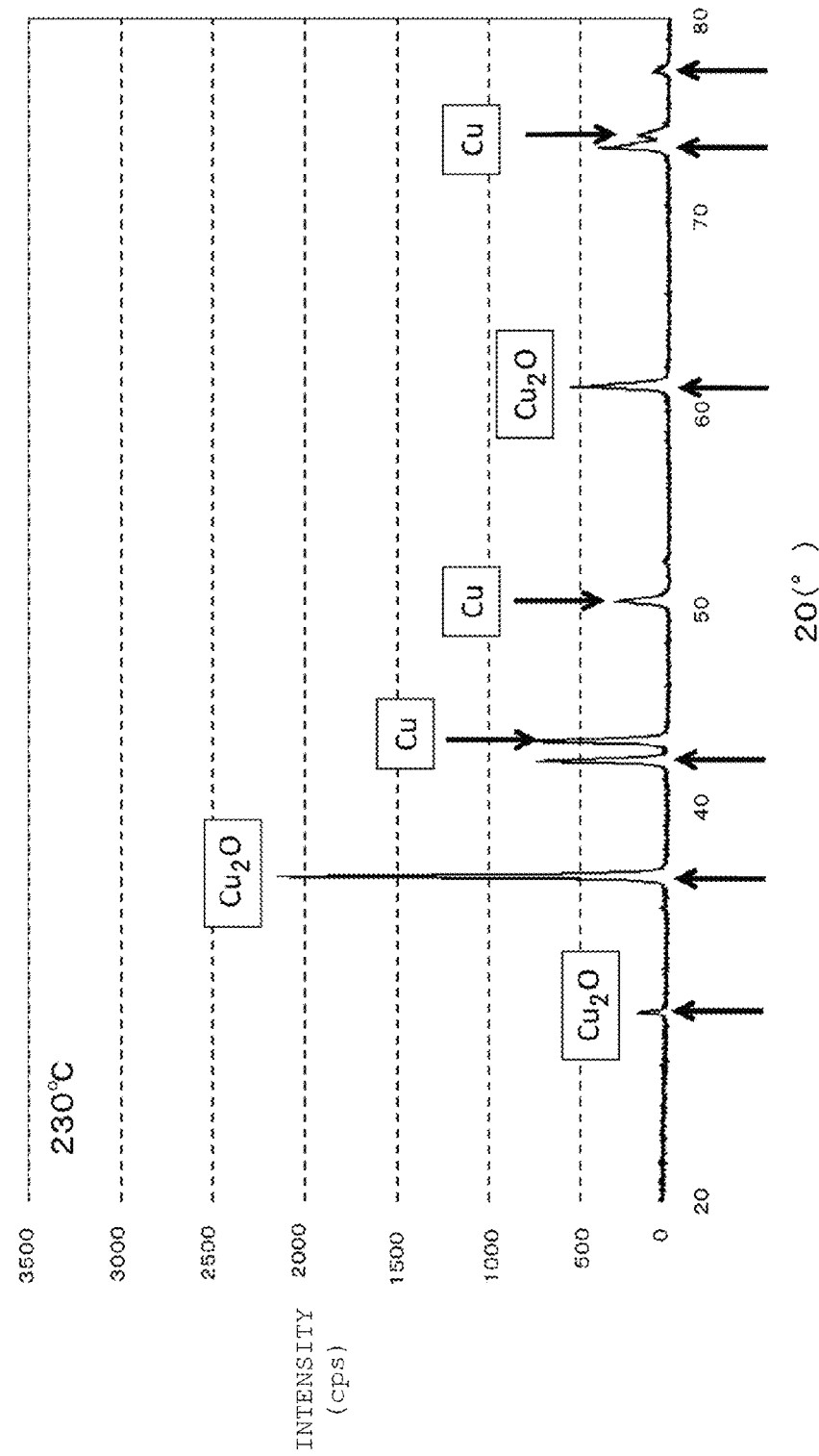

ELECTRONIC COMPONENT MODULE AND METHOD FOR MANUFACTURING ELECTRONIC COMPONENT MODULE

CROSS REFERENCE TO RELATED APPLICATIONS

This application claims benefit of priority to Japanese Patent Application 2014-019212 filed Feb. 4, 2014, and to International Patent Application No. PCT/JP2015/052018 filed Jan. 26, 2015, the entire content of which is incorporated herein by reference.

TECHNICAL FIELD

The present disclosure relates to an electronic component module manufactured with the use of a copper particle paste, and a method for manufacturing an electronic component module.

BACKGROUND

With the recent development of electronics technology, electronic component modules have been widely used which are obtained by, for example, mounting surface-mount electronic components onto circuit boards.

Further, for mounting the surface-mount electronic components (hereinafter, simply referred to as electronic components) onto the circuit boards, external terminals of the electronic components are mechanically and electrically connected to mounting electrodes (objects to be connected) provided on circuit boards with the use of conductive joint materials.

As such a joint material, Japanese Patent Application Laid-Open No. 2013-91835 suggests a sinterable joint material of a liquid or paste including copper nanoparticles of 1000 nm or less in particle size, where particle size peaks in the particle size distribution on the basis of the number of the copper nanoparticles include one or more peaks in each of a zone of 1 to 35 nm in particle size and a zone of more than 35 nm and 1000 nm or less in particle size, and the copper nanoparticles include primary particles and secondary particles of primary particles fused.

Furthermore, Japanese Patent Application Laid-Open No. 2013-91835 discloses the above-mentioned sinterable joint material containing a dispersant (dispersion stabilizer), and discloses an atmosphere of hydrogen, formic acid, or ethanol as a reducing atmosphere in a firing step.

Japanese Patent Application Laid-Open No. 2013-91835 also discloses applying a sintering heat treatment while applying pressure in the direction of joining an electronic component, in the case of joining the electronic component with the use of the sintering joint material.

SUMMARY

Problem to be Solved by the Disclosure

However, when there is a particle size peak in the zone of 1 to 35 nm in particle size, particles of such particle sizes, that is, particles of smaller sizes are likely to be agglomerated, and easily oxidized due to the large specific surface area, and there is thus the problem of poor material stability.

In addition, in the case of containing the dispersant, a contraction in volume is likely to be caused in firing to form voids, and there is thus the problem of decreasing the joint strength.

Furthermore, when the atmosphere of hydrogen, formic acid, or ethanol is regarded as a firing atmosphere, and for example, when the joint region is large between an electronic component and an object to be connected, there is the problem of failing to supply the reducing atmosphere gas into the inner region of the joint part, thereby making it difficult to fire the inner region in a desirable reducing atmosphere. More specifically, firing is more likely to proceed in the vicinity of the outer periphery of the joint part in contact with the reducing atmosphere, whereas firing is less likely to proceed in the inner region, and a non-sintered region will be formed in the inner region, thereby leading to the problem of decreasing the joint strength.

The present disclosure is intended to solve the problems mentioned above, and an object of the disclosure is to provide an electronic component module manufactured with the use of a copper particle paste which is excellent in stability (oxidation resistance) of copper particles as a conductive component, unlikely to form voids, able to form a joint part with high joint reliability, and able to ensure that not only the vicinity of the surface of the joint material constituting the joint part, but also the inner part of the joint material are sintered, and a method for manufacturing the electronic component module.

Means for Solving the Problem

In order to solve the problems mentioned above, an electronic component module according to the present disclosure is an electronic component module including a structure such that an external terminal included in an electronic component is electrically and mechanically connected to an object to be connected, with a joint material interposed therebetween, characterized in that the joint material is formed by making a copper particle paste sintered, the copper particle paste containing: copper particles having a particle size peak in the range of 0.1 µm to 5.0 µm in the particle size distribution and an average crystallite diameter before sintering in the range of 30 nm to 100 nm, and including, on particle surfaces, no dispersant that suppresses agglomeration; and an organic compound that achieves a reduction action at a firing temperature for making the copper particles sintered.

In addition, the joint material is preferably a copper sintered body with an average crystallite diameter in the range of 60 nm to 150 nm for the sintered copper particles.

The adjustment of the average crystallite diameter from 60 nm to 150 nm after being sintered forms a stable sintered body.

In addition, in the copper particle paste mentioned above, the organic compound is preferably an organic compound having a hydroxy group.

The use of the organic compound having a hydroxy group as the organic compound that achieves a reduction action at the firing temperature for making the copper particles sintered makes it possible to remove an oxide film formed on the surfaces of the copper particles in a firing step, and ensure that copper is sintered without oxidizing the copper in the firing step, thereby allowing the present disclosure to be made more effective.

In addition, the organic compound preferably includes at least one selected from the group consisting of triethanolamine, glycerin, ethylene glycol, triethylene glycol, diethylene glycol, and dipropylene glycol.

The use of at least one from the group mentioned above can make the present disclosure more effective.

In addition, the object to be connected is preferably a mounting electrode provided on a circuit board.

Connecting the external terminal of the electronic component to the mounting electrode provided on the circuit board by the method according to the present disclosure makes it possible to reliably manufacture a highly reliable electronic component module which has a structure such that a surface-mount electronic component such as an IC chip and a multilayer ceramic capacitor, for example, is mounted on the circuit board.

In addition, the object to be connected is preferably a metallic terminal attached to the external terminal.

Attaching the external terminal of the electronic component to the metallic terminal by the method according to the present disclosure makes it possible to reliably manufacture a highly reliable electronic component module with a terminal.

Furthermore, a method for manufacturing an electronic component module according to the present disclosure is a method for manufacturing an electronic component module including a structure such that an external terminal included in an electronic component is electrically and mechanically connected to an object to be connected, with a joint material interposed therebetween, the method characterized in that it includes the steps of: locating the electronic component and the object to be joined such that the external terminal of the electronic component is opposed to the object to be connected, with a copper particle paste interposed therebetween, the copper particle paste containing copper particles having a particle size peak in the range of 0.1 μm to 5.0 μm in the particle size distribution and an average crystallite diameter before sintering in the range of 30 nm to 100 nm, and including, on particle surfaces, no dispersant that suppresses agglomeration, and an organic compound that achieves a reduction action at a firing temperature for making the copper particles sintered; and carrying out a heat treatment to cause the copper particles included in the copper particle paste to be sintered, thereby forming a copper sintered body of 60 to 150 nm in average crystallite diameter for the copper particles, and thus joining the external terminal of the electronic component and the object to be connected, with the copper sintered body interposed therebetween.

In the method for manufacturing an electronic component module according to the present disclosure, the heat treatment is preferably carried out without applying an outside force, with the electronic component disposed on the object to be joined, such that the external terminal of the electronic component is opposed to the object to be connected, with the copper particle paste interposed therebetween.

The use of the copper particle paste as described above makes it possible to carry out the heat treatment without applying any outside force, and applying no pressure makes it possible to reduce damage to the electronic component, and allows a minute joint part to be formed.

In addition, the heat treatment is preferably carried out in an inert atmosphere.

The heat treatment in the inert atmosphere makes it possible to further ensure that the copper particles constituting the copper particle paste are sintered, thereby allowing the present disclosure to be made more effective.

Advantageous Effect of the Disclosure

The copper particles with a particle size peak in the range of 0.1 to 5.0 μm in the particle size distribution, which are used as copper particles constituting the copper particle paste mentioned above, are not excessively fine, and thus copper particles which are unlikely to be oxidized and excellent in stability, on the other hand, small from 30 to 100 nm in average crystallite diameter in terms of sinterability, able to be sintered at low temperatures of 300° C. or lower, and after being sintered, become a copper sintered body around 60 to 150 nm in average crystallite diameter, thereby serve as a stable joint material.

In addition, the copper particles have, at the surfaces thereof, no dispersant for suppressing agglomeration, and a sintered body can be thus obtained which has a high-density copper sintered body obtained by sintering, and has a low proportion of voids.

More specifically, while so-called nanoparticles of 100 nm or less in copper particle size are agglomerated in the absence of a dispersant, the particle size peak of the particle size distribution for the copper particles falls within the range of 0.1 to 5.0 μm in the copper particle paste mentioned above, thus making it possible to suppress agglomeration without using any dispersant.

It is to be noted that in the case of nanoparticles of 100 nm or less in average crystallite diameter, it is possible to make the nanoparticles sintered at low temperatures due to the effect of the nanoparticles (nanosized effect), but the present disclosure allows low-temperature sintering at low temperatures of 300° C. or lower with the average crystallite diameter for the copper particles in the range of 30 to 100 nm.

More specifically, increasing the particle size peak of the particle size distribution for the copper particles to 0.1 to 5.0 μm and reducing the average crystallite diameter to 30 to 100 nm make it possible to prevent agglomeration without combining any dispersant, and allow low-temperature sintering at 300° C. or lower.

In addition, the cooper particle paste mentioned above contains the organic compound (for example, solvent) that achieves a reduction action at the firing temperature for making the copper particles sintered, and the reduction action of the organic compound thus reduces a copper oxide on the copper particle surfaces, which causes sintering to be constrained, thereby making it possible to achieve sintering under an inert atmosphere particularly without the need for firing in a reducing atmosphere. It is to be noted that while firing under a reducing atmosphere with the use of a reducing gas is performed, when the copper particle paste is used as a joint material, there is a problem that sintering proceeds at the surface and peripheral part of the joint part, whereas sintering is likely to be insufficient within the joint part, containing the organic compound (for example, solvent) that achieves a reduction action as described above can solve this problem without the need for firing under a reducing atmosphere.

It is to be noted that it is believed to be by the mechanism described below that the copper particles in the copper particle paste are sintered at low temperatures.

FIGS. 1A to 1D are diagrams schematically illustrating a sintering process of copper particles.

As shown in FIG. 1A, copper particles 10 for use in the copper particle paste mentioned above have small crystallites 11 of 30 to 100 nm in average size (average crystallite size), and have high grain boundary energy. In addition, the copper particles 10 have, at normal temperature, surfaces covered with an oxide film (copper oxide) 12.

When the copper particle paste (copper particles) 1 is heated to a reflow temperature (for example, 230° C.), an organic compound (for example, solvent) 13 that achieves a reduction action at a firing temperature for making the copper particles sintered, present around the copper particles 10, acts as a reductant, thereby reducing the oxide film (copper oxide) 12 on the surfaces of the copper particles 10 as shown in FIG. 1B.

Thus, when the oxide film (copper oxide) 12 on the surfaces of the copper particles 10 is reduced, the copper particles 10 which have a small average crystallite diameter and high grain boundary energy undergo neck growth even at low temperatures around the reflow temperature to unite as shown in FIG. 1C, thereby increasing the crystallite diameter. As a result, as shown in FIG. 1D, the copper particles 10 themselves increase in size, whereas the average crystallite diameter also increase to 60 to 150 nm, and a stable copper sintered body will be thus formed.

The copper particles constituting the copper particle paste mentioned above can be made sintered efficiently even at low temperatures by the mechanism.

In addition, the electronic component module according to the present disclosure has a structure such that the external terminal included in the electronic component is electrically and mechanically connected to an object to be connected with a joint material interposed therebetween, formed by baking the copper particle paste, and the external terminal of the electronic component and the object to be connected are reliably joined with a joint part interposed therebetween, composed of a high-density copper sintered body of which voids account for a small proportion, thus making it possible to reliably provide an electronic component module with high reliability.

Furthermore, in the method for manufacturing an electronic component module according to the present disclosure, the heat treatment is carried out with the electronic component and the object to be connected located such that the external terminal of the electronic component is opposed to the object to be connected, with the copper particle paste interposed therebetween, thereby causing the copper particles included in the copper particle paste to be sintered, such that the external terminal of the electronic component and the object to be connected are joined with the copper sintered body of 60 to 150 nm in average crystallite diameter. Thus, it becomes possible to ensure that the external terminal of the electronic component and the object to be connected are joined with a joint part composed of the high-density copper sintered body of which voids account for a small proportion, thereby allowing a highly reliable electronic component module to be manufactured efficiently.

BRIEF DESCRIPTION OF THE DRAWINGS

FIG. 6A is a diagram for confirming an action of triethanolamine as a reductant, which illustrates an XRD chart in the case of heating a copper (I) oxide powder with the triethanolamine applied for 10 min at 230° C.

DETAILED DESCRIPTION

Features of the present disclosure will be described in more detail below with reference to embodiments of the present disclosure.

First Embodiment

The electronic component module according to a First Embodiment of the present disclosure is an electronic component module that has a structure such that an external terminal included in an electronic component is electrically and mechanically connected to an object to be connected, with a joint material interposed therebetween, formed by making a copper particle paste sintered.

For preparing the copper particle paste to serve as the junction material, copper particles were prepared first with the particle size peak of the particle size distribution in the range of 0.1 to 5.0 μm as copper particles, and with the average crystallite diameter before sintering in the range of 30 to 100 nm.

In addition, liquid triethanolamine at normal temperature was prepared as an organic compound for achieving a reduction action at the firing temperature in sintering for the copper particles.

Then, the copper particles and the triethanolamine were combined in such a proportion of 87:13 in ratio by weight, and subjected to kneading to prepare a copper particle paste.

It is to be noted that the particle size peak of the particle size distribution for the copper particles was obtained by the following method. First, the copper particles were observed with the use of a scanning electron microscope, the horizontal feret's diameter was measured for 200 particles in the field of view. Then, the observed measurement values were converted to spheres to calculate the average volume particle diameter, and from the result, the average particle peak was obtained.

In addition, the average crystallite diameter before sintering was obtained by the following method. First, the copper particles were subjected to an X-ray diffraction measurement, thereby finding three peaks of peaks <111>, <200>, and <311>. Then, crystallite diameters were calculated by a Rietveld method with the use of the three peaks obtained, and the average value for the diameters was regarded as the average crystallite diameter.

<Evaluation of Copper Particle Paste>

(1) Joint Strength

With the use of the copper particle paste prepared in the way described above, oxygen-free copper sample pieces were joined to each other and checked for joint strength by the method described below.

Figure 1A:
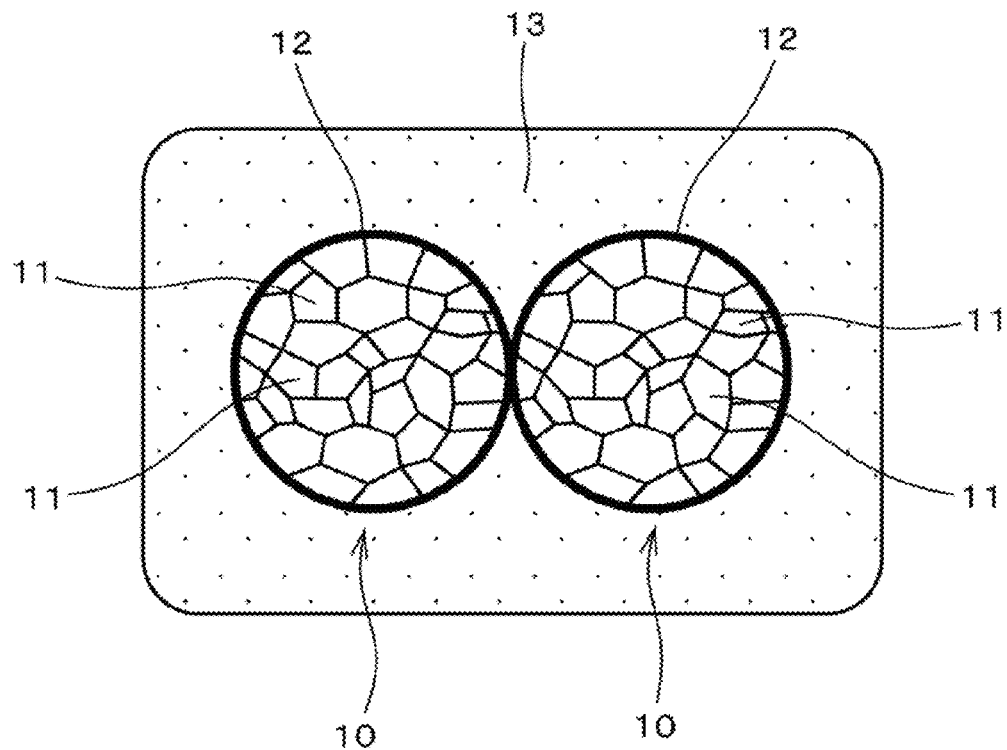
FIG. 1A is a diagram schematically illustrating a step of a sintering process for copper particles for use in a copper particle paste.
Figure 1B:
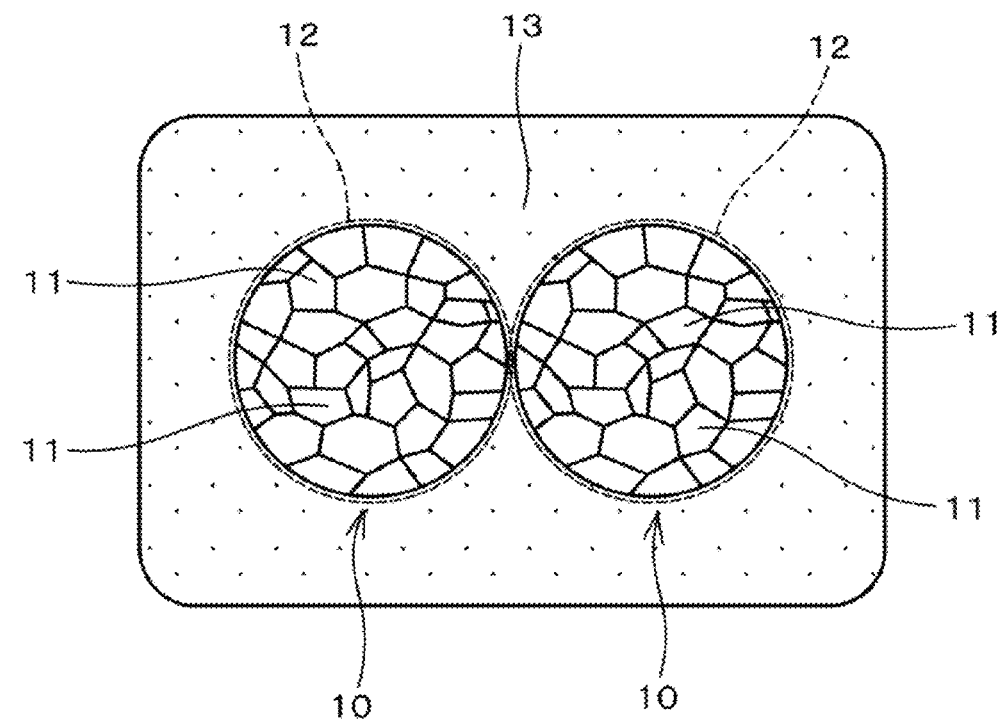
FIG. 1B is a diagram schematically illustrating another step of the sintering process for copper particles for use in the copper particle paste.
Figure 1C:
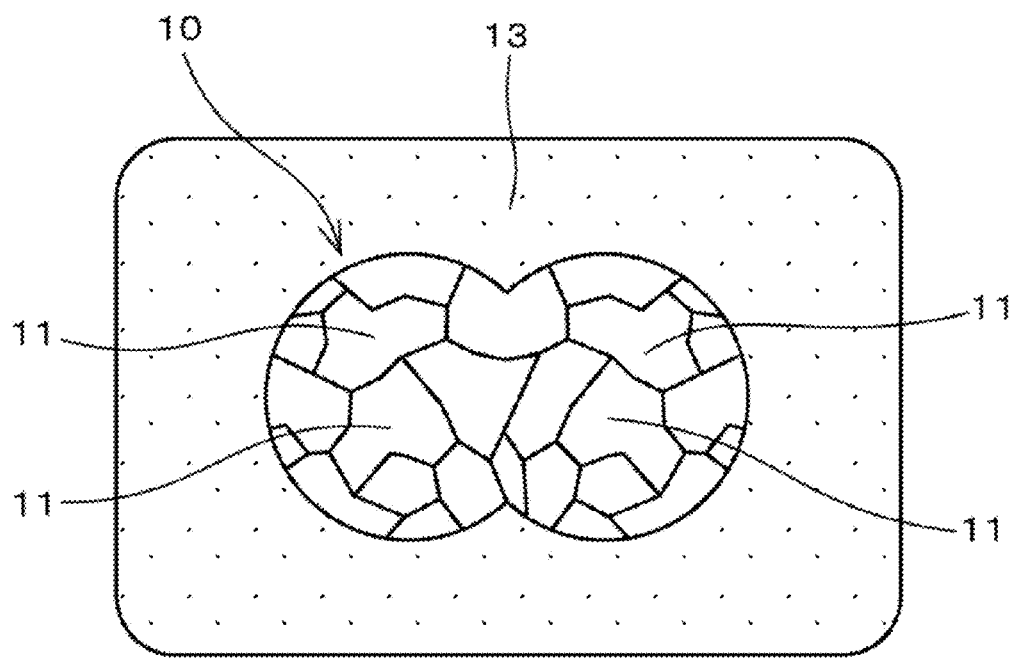
FIG. 1C is a diagram schematically illustrating yet another step of the sintering process for copper particles for use in the copper particle paste.
Figure 1D:
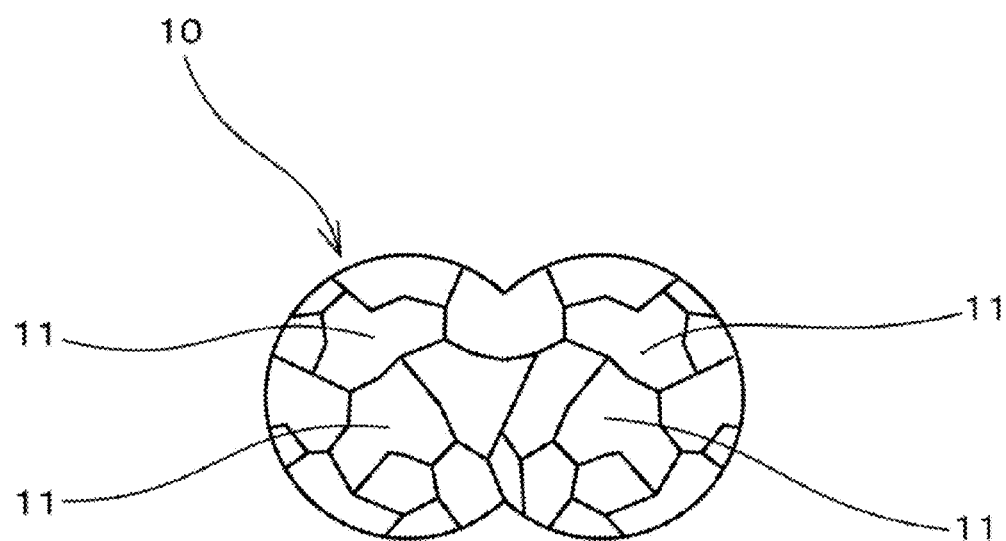
FIG. 1D is a diagram schematically illustrating yet another step of the sintering process for copper particles for use in the copper particle paste.
Figure 2:
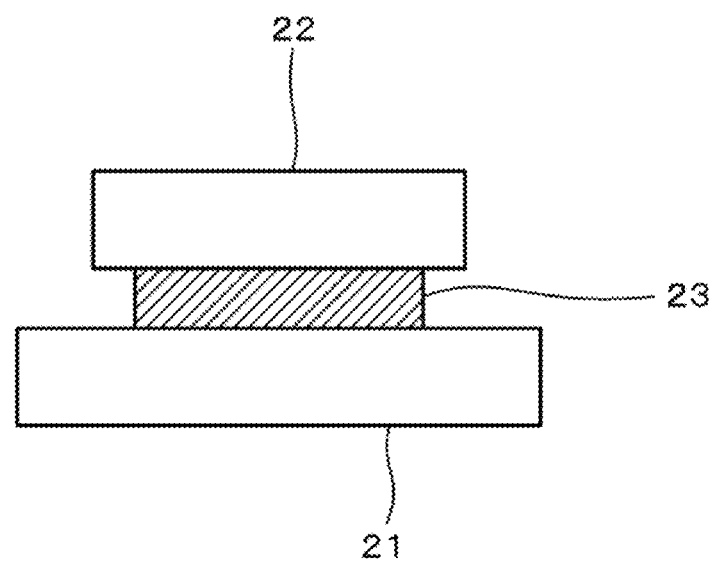
FIG. 2 is a diagram illustrating a joint part joined with the use of the copper particle paste.

In this regard, as shown in FIG. 2, a first oxygen-free copper sample piece 21 of 5 mm×5 mm in planar size and 1 mm in thickness and a second oxygen-free copper sample piece 22 of 3 mm×3 mm in planar size and 1 mm in thickness were joined with a copper sintered body 23 obtained by firing the copper particle paste prepared in the way described above.

For joining the first oxygen-free copper sample piece 21 and the second oxygen-free copper sample piece 22 with the use of the copper particle paste, the copper particle paste was applied for 40 μm in coating thickness onto the first oxygen-free copper sample piece 21 with the use of a metal mask provided with through holes that cause the copper particle paste to pass therethrough (through holes of 2000 μm in diameter and circular in planar shape).

Then, the second oxygen-free copper sample piece 22 was disposed on the copper particle paste applied to the first oxygen-free copper sample piece 21, and subjected to firing under the conditions of firing temperature: 230° C., firing time: 60 min, and firing atmosphere: nitrogen without particularly applying any stress, thereby, as shown in FIG. 2, joining the first oxygen-free copper sample piece 21 and the second oxygen-free copper sample piece 22 with the joint material (the copper sintered body of the copper particle paste sintered) 23 interposed therebetween.

Then, the joint strength between the first oxygen-free copper sample piece 21 and the second oxygen-free copper sample piece 22 was measured. The joint strength was measured by measuring the shear strength with the use of a general bond tester Dage 4000 from Dage.

Figure 3:
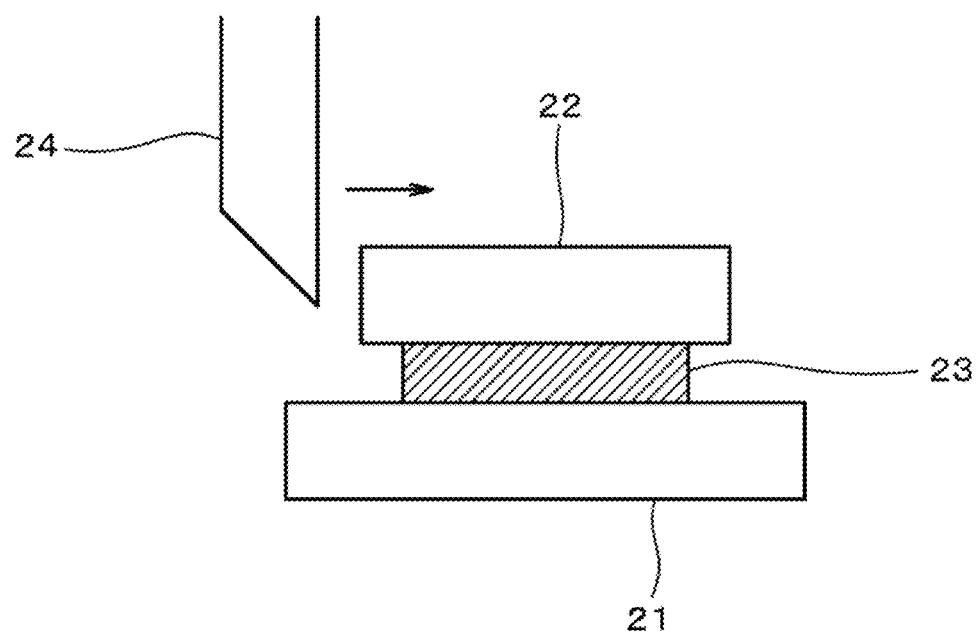
FIG. 3 is a diagram for explaining a method for measuring the joint strength of joint part joined with the use of the copper particle paste.

It is to be noted that for the measurement, as shown in FIG. 3, the lower first oxygen-free copper sample piece 21 was fixed with a fixing jig, and shearing was applied at a shear rate of 50 μm/s and a distance of 50 μm from the surface of the oxygen-free copper sample piece 21 to a head of the tool with the use of a shearing tool 24 of 4 mm in tool width. Then, the fracture surface was photographed, and the joint area was measured by image processing.

Then, the shear strength value was divided by the joint area to obtain the shear strength (MPa) per unit area.

As a result, it has been confirmed that a high strength of 36 MPa is achieved as the shear strength.

(2) In Regard to Average Crystallite Diameter Before and After Firing

The average crystallite diameter before firing was measured by a method of applying an ink of the copper particle paste onto a glass plate, calculating crystallite diameters by a Rietveld method from the three peaks of peaks <111>, <200>, and <311> obtained by the method described above, that is, the X-ray diffraction measurement, and figuring out the average value for the diameters. The average crystallite diameter after firing was measured by a method of extracting the sintered body subjected to shearing with the use of tweezers, disposing the body on a glass plate, calculating crystallite diameters by a Rietveld method from the three peaks of peaks <111>, <200>, and <311> obtained by the method described above, that is, the X-ray diffraction measurement, and figuring out the average value for the diameters.

More specifically, the copper particle paste was applied by printing for 40 μm in coating thickness onto the first non-oxygen copper sample piece 21 with the use of a metal mask provided with through holes of 2000 μm (2 mm) in diameter and circular in planar shape, and subjected to firing under the conditions of firing temperature: 230° C., firing time: 60 min, and firing atmosphere: nitrogen, thereby checking the crystallite diameters before and after firing.

As a result, it has been confirmed that the average crystallite diameter of 62 nm at the stage before the firing is increased up to 102 μm after the firing.

As just described, when the average crystallite diameter at the stage before the firing is reduced so as to meet the range specified by the requirement of the present disclosure, it becomes possible to prevent agglomeration of the copper particles without using any dispersant, and the mechanism described previously with reference to FIGS. 1A to 1D makes it possible to achieve sintering at lower temperatures. As a result, it becomes possible to form a joint material of a high-density copper sintered body of which voids account for a small proportion, without requiring any firing at high temperatures.

FIGS. 4A and 4B and 5A and 5B show micrographs (SEM images) of copper particles before and after firing copper particle pastes using the copper particles within the range specified by the requirement of the present disclosure and the copper particles outside the range.

Figure 4A:
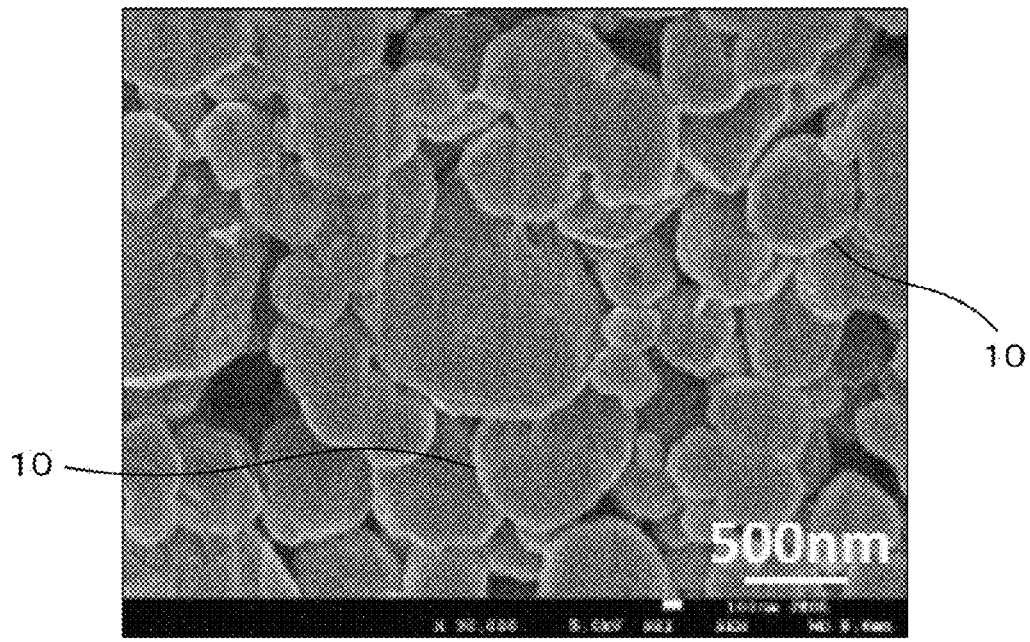
FIG. 4A is a micrograph (SEM image) showing the state of copper particles before firing in a copper particle paste using the copper particles of 56.7 nm in average crystallite diameter.
Figure 4B:
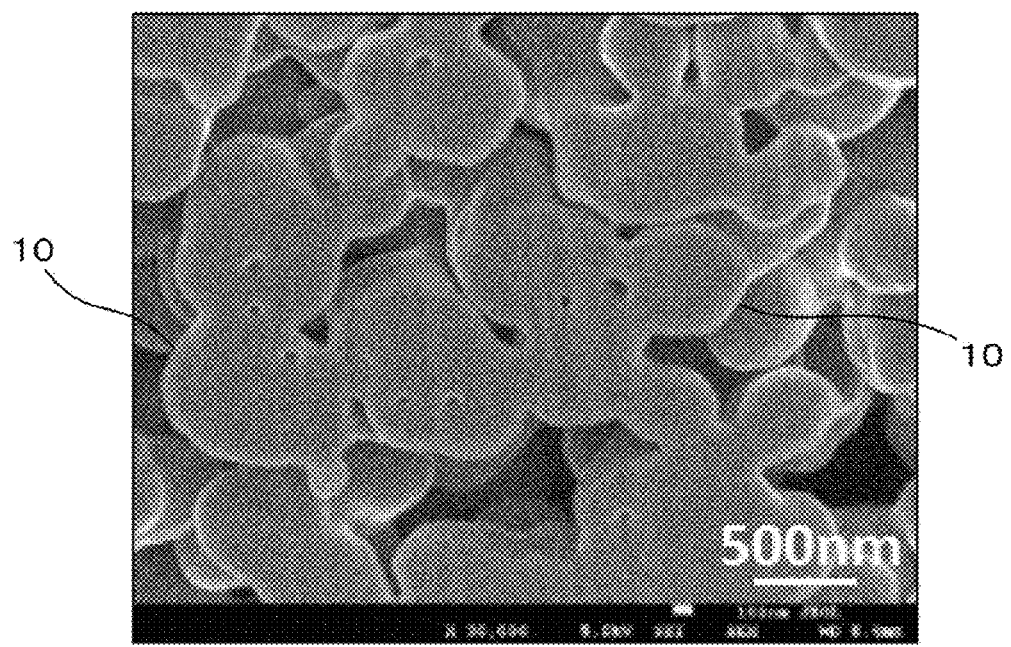
FIG. 4B is a micrograph (SEM image) showing the state of the copper particles after firing in the copper particle paste using the copper particles of 56.7 nm in average crystallite diameter.

It is to be noted that FIG. 4A is a micrograph (SEM image) showing the state of the copper particles before the firing in the copper particle paste using the copper particles of 56.7 nm in average crystallite diameter within the range specified by the requirement of the present disclosure, whereas FIG. 4B is a micrograph (SEM image) showing the state of the copper particles after the firing.

Figure 5A:
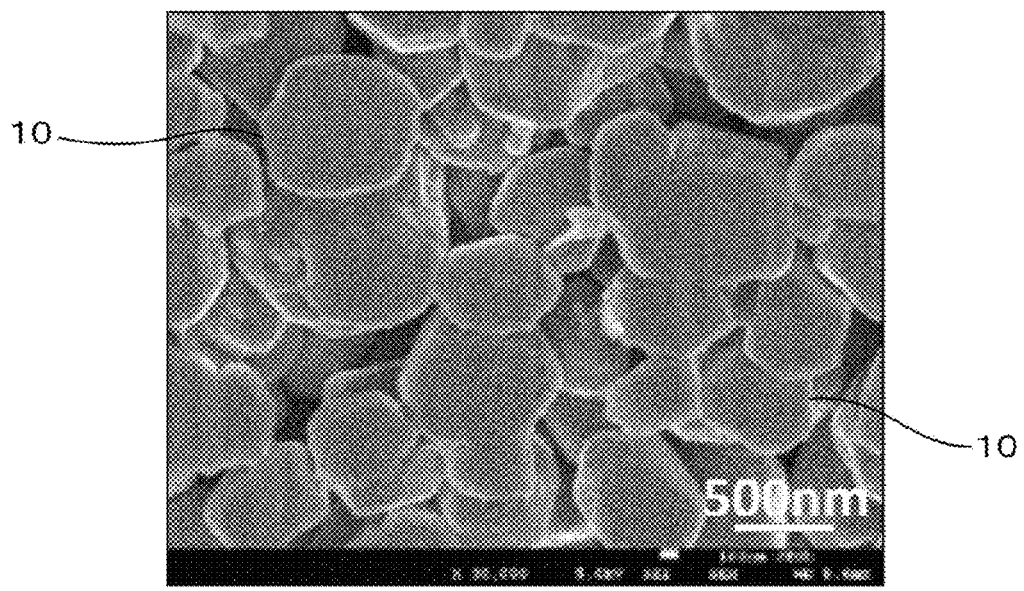
FIG. 5A is a micrograph (SEM image) showing the state of copper particles before firing in a copper particle paste using the copper particles of 107.2 nm in average crystallite diameter.
Figure 5B:
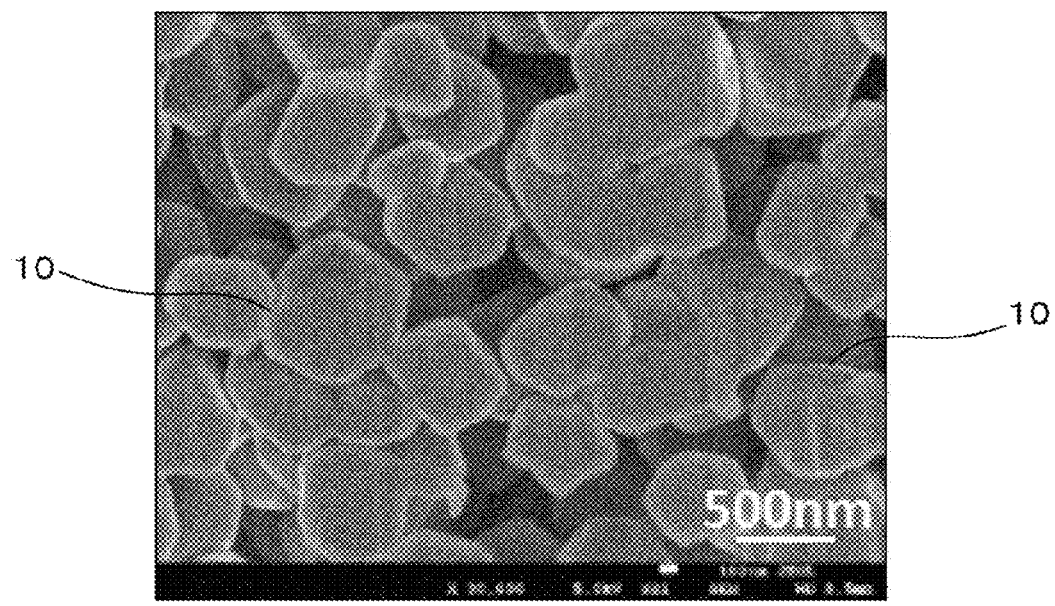
FIG. 5B is a micrograph (SEM image) showing the state of the copper particles after firing in the copper particle paste using the copper particles of 107.2 nm in average crystallite diameter.

In addition, FIG. 5A is a micrograph (SEM image) showing the state of the copper particles before the firing in the copper particle paste using the copper particles of 107.2 nm in average crystallite diameter outside the range specified by the requirement of the present disclosure, whereas FIG. 5B is a micrograph (SEM image) showing the state of the copper particles after the firing.

As can be seen from FIGS. 5A and 5B, in the case of the copper particle paste using the copper particles 10 of 107.2 nm in average crystallite diameter outside the range specified by the requirement of the present disclosure, the copper particles 10 have been hardly found to undergo neck growth.

In contrast, as can be seen from FIGS. 4A and 4B, in the case of the copper particle paste using the copper particles 10 of 56.7 nm in average crystallite diameter within the range specified by the requirement of the present disclosure, it has been confirmed that the copper particles 10 undergo neck growth, that is, are sintered sufficiently.

(3) Evaluation of Triethanolamine for Reducing Performance

The triethanolamine used in the copper particle paste described above as an organic compound (solvent) that achieves a reduction action at a firing temperature for making the copper particles sintered was checked for reducing performance by the following method.

For confirming the reducing performance of the triethanolamine, an experiment was carried out as described below with the use of a commercially available copper (I) oxide ($Cu_2O$) powder. First, a copper (I) oxide powder was disposed on a glass substrate, liquid triethanolamine at normal temperature was applied thereto, and after heating for 10 min at a predetermined temperature on a hot plate, a composition analysis was carried out by XRD.

The results in the case of heating for 10 min at 200° C., and in the case of heating for 10 min at 230° C. as a temperature condition near the melting point of Sn commonly used as an electrode material will be described herein with respect to FIGS. 6A and 6B.

Figure 6B:
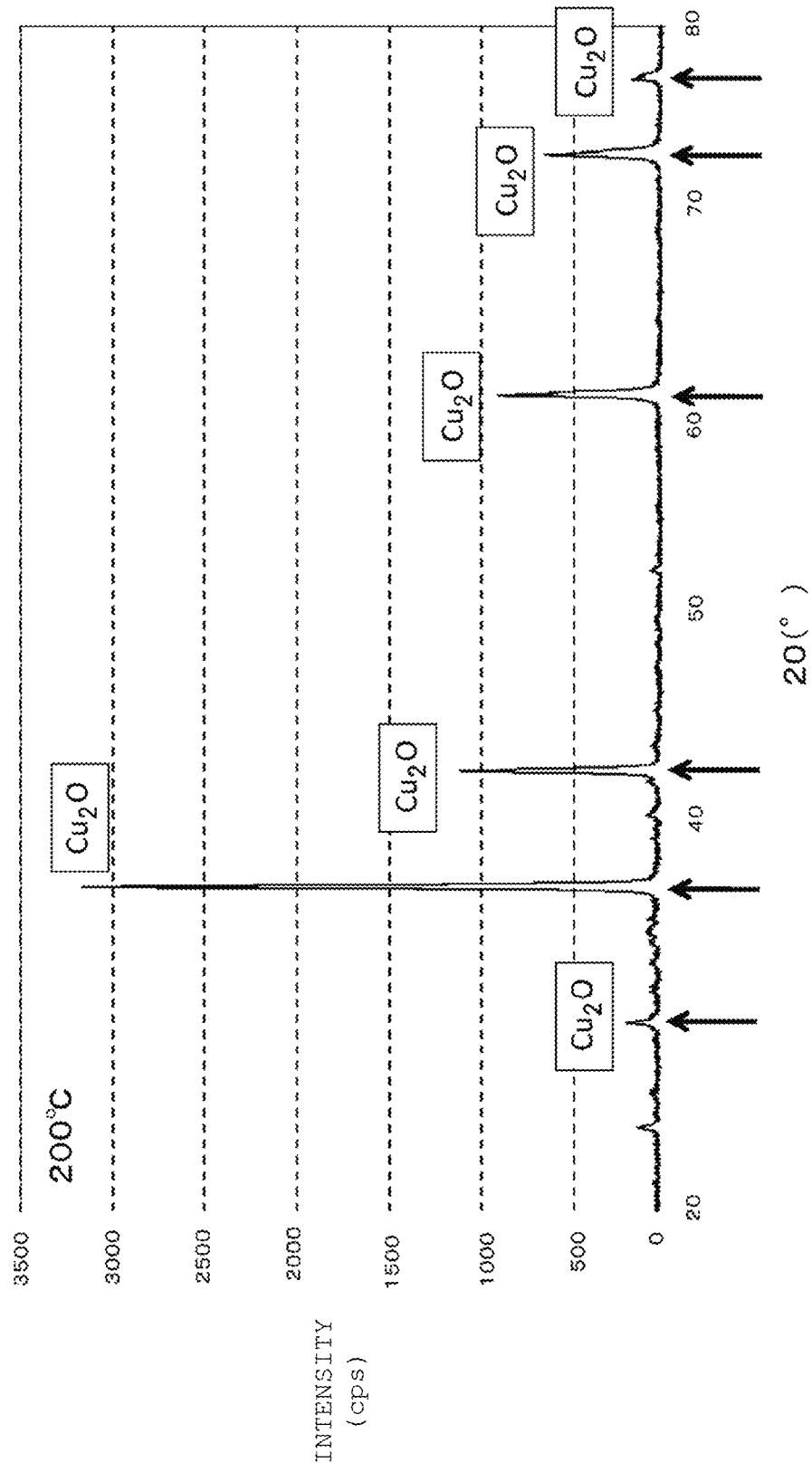
FIG. 6B is a diagram for confirming an action of triethanolamine as a reductant, which illustrates an XRD chart in the case of heating a copper (I) oxide powder with the triethanolamine applied for 10 min at 200° C.

It is to be noted that FIG. 6A is a diagram showing an XRD chart in the case of heating the copper (I) oxide powder with the triethanolamine applied for 10 min at 230° C. as a temperature condition near the melting point of Sn commonly used as an electrode material, whereas FIG. 6B is a diagram showing an XRD chart in the case of heating the copper (I) oxide powder with the triethanolamine applied for 10 min at 200° C.

As a result, as shown in FIG. 6B, it has been confirmed that in the case of the heating temperature of 200° C., there is no Cu peak found while the peak of copper (I) oxide ($Cu_2O$) remains high, thus failing to achieve any reduction action.

On the other hand, it has been confirmed that in the case of the temperature of 230° C. as a temperature condition near the melting point of Sn commonly used as an electrode material, as shown in FIG. 6A, there is a clear Cu peak found while the peak of copper (I) oxide ($Cu_2O$) is reduced, that is, a reduction action is achieved.

It is to be noted that while the triethanolamine was used as an organic compound that has reducing performance in this embodiment, it has been confirmed that organic compounds having a hydroxy group have reducing performance, such as glycerin, ethylene glycol, triethylene glycol, diethylene glycol, and dipropylene glycol, besides triethanolamine, and it is also possible to use these substances as an organic compound that has reducing performance.

Further, it is also possible to use yet other organic compounds as the organic compound for achieving a reduction action. While it is desirable in the present disclosure to use a liquid organic compound at normal temperature as the organic compound for achieving a reduction action mentioned above, it is also possible to use solid substances at normal temperature in some cases, and in that regard, the substances can be dissolved in other solvents, if necessary, and used.

Figure 7:
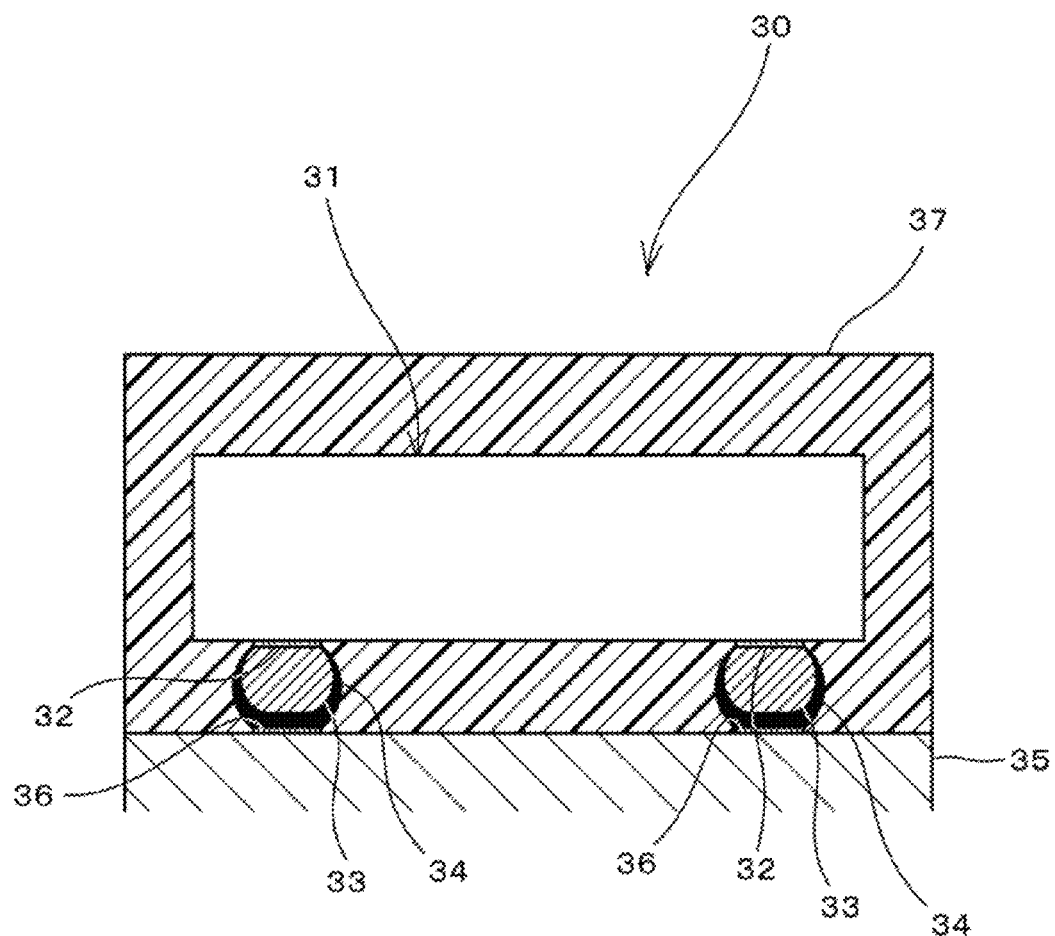
FIG. 7 is a diagram illustrating the configuration of an electronic component module according to a First Embodiment of the present disclosure.

FIG. 7 is a diagram illustrating an electronic component module according to an embodiment (First Embodiment) of the present disclosure, which has a structure electrically and mechanically connected to objects to be connected, with a joint material interposed therebetween, formed by the sintered copper particle paste prepared in the way described above.

This electronic component module 30 is an electronic component module that has a structure such that as shown in FIG. 7, gold bumps (external terminals) 33 formed on surface electrodes 32 of an IC chip (electronic component according to the present disclosure) 31 are electrically and mechanically connected onto mounting electrodes (objects to be connected) 36 of, for example, copper, formed on a circuit board 35, with a copper sintered body (joint material) 34 interposed therebetween, and such that the IC chip (electronic component) 31 is sealed with a sealing resin 37.

It is to be noted that while FIG. 7 shows the structure of the IC chip 31 mounted on the circuit board 35, other electronic components may be mounted such as a chip capacitor and a chip resistance.

The copper sintered body 34 for the joint material mentioned above is formed by baking the copper particle paste mentioned above, and is a copper sintered body with an average crystallite diameter within the range of 60 to 150 nm after sintering.

Next, a method for manufacturing the electronic component module 30 will be described. For manufacturing the electronic component module, the circuit board 35 is first prepared which includes mounting electrodes (land electrodes) 36 on the surface thereof.

In addition, the IC chip (the electronic component according to the present disclosure) 31 is prepared which has the gold bumps (external terminals) 33 formed on the surface electrodes 32.

Then, the copper particle paste mentioned above is applied onto the mounting electrodes 36 on the circuit board 35, and the IC chip (electronic component) 31 is mounted onto the mounting electrodes 36 on the circuit board 35 in such a manner that the gold bumps (external terminals) 33 on the IC chip (electronic component) 31 are located on the copper particle paste applied onto the mounting electrodes 36 on the circuit board 35. Then, without particularly pressing the IC chip (electronic component) 31 toward the circuit board 35, the copper particles included in the copper particle paste are subjected to sintering by firing at 230° C. in a nitrogen atmosphere (inert atmosphere), thereby connecting the gold bumps (external terminals) 33 to the mounting electrode (objects to be connected) 36 with a copper sintered body (joint material) 34 interposed therebetween.

Then, the IC chip (electronic component) 31 mounted on the circuit board 35 is subjected to sealing with the sealing resin 37. Thus, the electronic component module 30 is obtained which is structured as shown in FIG. 7.

This electronic component module 30 has a structure such that the gold bumps (external terminals) 33 on the IC chip (electronic component) 31 are electrically and mechanically connected to the mounting electrodes (objects to be connected) 36 of the circuit board 35 to be connected, with the copper sintered body (joint material) 34 with an average crystallite diameter in the range of 60 to 150 nm after the firing, which is formed by baking the copper particle paste mentioned above.

Accordingly, a highly reliable electronic component module can be provided where the gold bumps (external terminals) 33 on the IC chip (electronic component) 31 and the mounting electrodes (objects to be connected) 36 are reliably joined with the joint material 34 of the high-density copper sintered body of which voids account for a small proportion.

In addition, according to the method for manufacturing the electronic component module as described above, the heat treatment is carried out with the IC chip (electronic component) 31 and the mounting electrodes (objects to be connected) 36 located such that the gold bumps (external terminals) 33 on the IC chip (electronic component) 31 are opposed to the objects 36 to be connected with the copper particle paste interposed therebetween to serve as the copper sintered body 34 after firing, thereby making it possible to join the gold bumps (external terminals) 33 on the IC chip (electronic component) 31 and the objects 36 to be connected with the joint material (copper sintered body) 34 of the high-density copper sintered body of which voids account for a small proportion.

Accordingly, a highly reliable electronic component module can be manufactured efficiently where the gold bumps (external terminals) 33 on the IC chip (electronic component) 31 and the objects 36 to be connected are joined reliably.

In addition, the heat treatment is carried out without applying any outside force, thus making it possible to reduce damage to the IC chip (electronic component) 31, and making it possible to form minute joint parts.

It is to be noted that while a case where the bumps on the IC chip (electronic component) are composed of gold, whereas the mounting electrodes (land electrodes) are composed of copper has been explained as an example in the First Embodiment, it is possible to use Ag, Cu, Ni, Ag—Pd, and the like as a constituent material for the bumps, and it is possible to use Au, Ag, Ni, Ag—Pd, and the like as a constituent material for the mounting electrodes (land electrodes).

Second Embodiment

Figure 8:
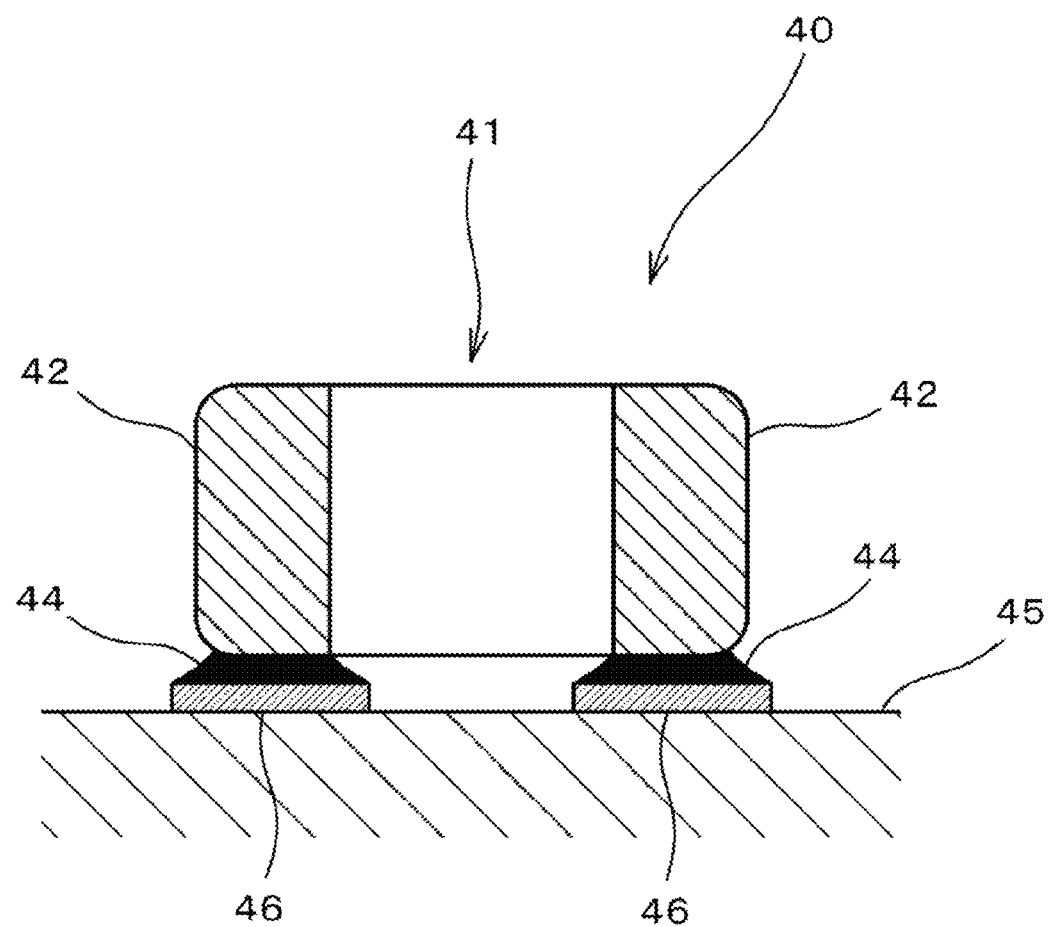
FIG. 8 is a diagram illustrating the configuration of an electronic component module according to a Second Embodiment of the present disclosure.

FIG. 8 is a diagram illustrating an electronic component module according to an embodiment (Second Embodiment) of the present disclosure.

This electronic component module 40 is an electronic component module that has a structure such that external terminals 42 of copper provided on a multilayer ceramic capacitor 41 are electrically and mechanically connected to mounting electrodes (objects to be connected in the present disclosure) 46 of copper formed on a circuit board (alumina board) 45, with a copper sintered body (joint material) 44 interposed therebetween, as shown in FIG. 8.

In this electronic component module 40, it has been confirmed that the joint strength is 45 MPa between the mounting electrodes (land electrodes) 46 and the external electrodes 42.

This electronic component module 40 is formed by applying a copper particle paste to serve as the copper sintered body 44 after firing onto the mounting electrodes (land electrodes) 46 formed on the surface of the circuit board 45, disposing the multilayer ceramic capacitor 41 with the external terminals 42 formed at both ends such that the mounting electrodes (land electrodes) 46 and the external terminals 42 are opposed with the copper particle paste interposed therebetween, and carrying out firing at 230° C. in a nitrogen atmosphere (inert atmosphere) without particularly applying any outside force, thereby providing the sintered copper particles included in the copper particle paste.

Figure 9:
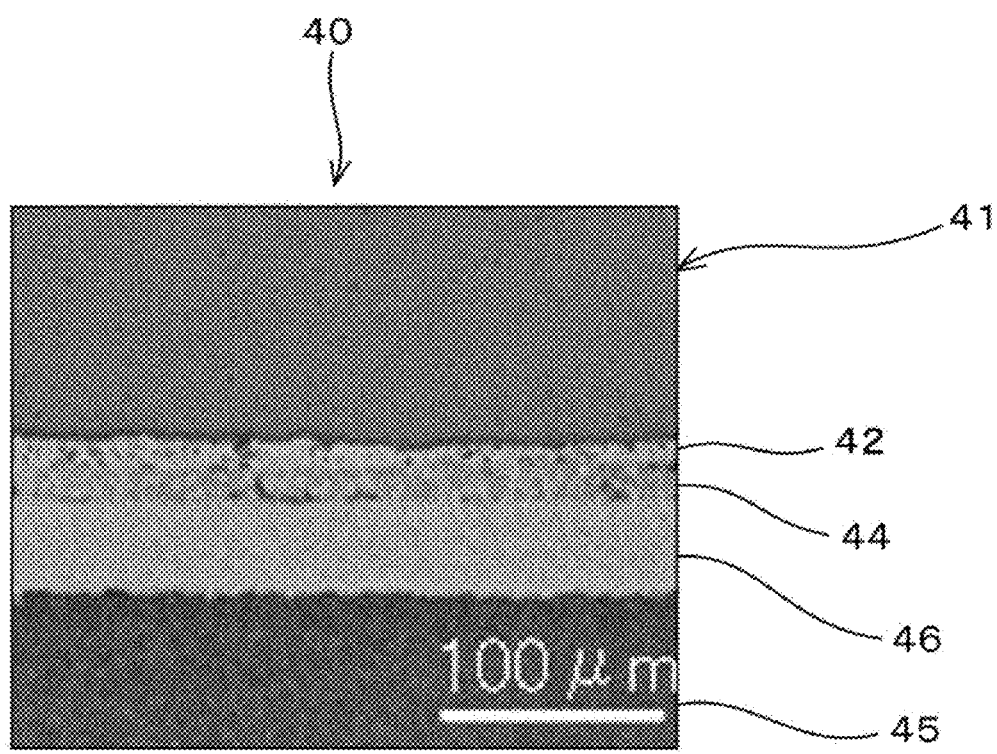
FIG. 9 is a micrograph (SEM image) of a vicinity of the joint part between an electronic component and a circuit board in the electronic component module according to the Second Embodiment of the present disclosure.

FIG. 9 is a micrograph (SEM image) of a vicinity of the joint part between the multilayer ceramic capacitor 41 and the circuit board 45.

From FIG. 9, it is found that the external terminals 42 of copper on the multilayer ceramic capacitor 41 are joined to the mounting electrodes 46 of copper on the circuit board 45 with the joint material of the copper sintered body 44 interposed therebetween.

From the Second Embodiment herein, it is found that without forming any Sn plated layer, solder plated layer, or the like on the external terminals 42 on the multilayer ceramic capacitor 41, the external terminals 42 of Cu on the multilayer ceramic capacitor 41 and the mounting electrodes 46 of copper on the circuit board 45 are joined directly with the use of the copper particle paste mentioned above, thereby making it possible to achieve highly reliable joints without forming any intermetallic compound.

It is to be noted that the constituent material of the external terminals on the multilayer ceramic capacitor is not limited to copper, but may be formed from gold, silver, silver-palladium, nickel, or the like. In addition, the copper may contain glass.

Third Embodiment

Figure 10:
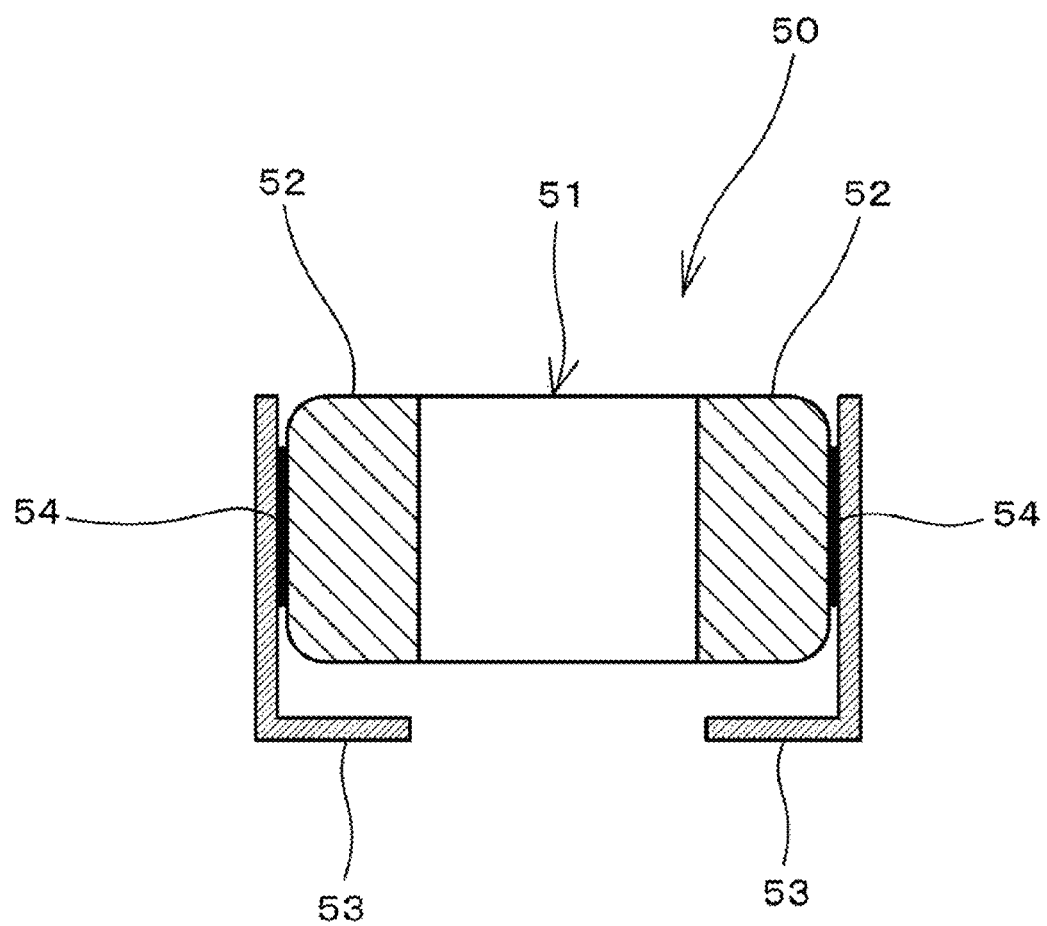
FIG. 10 is a diagram illustrating the configuration of an electronic component module according to a Third Embodiment of the present disclosure.

FIG. 10 is a diagram illustrating an electronic component with metallic terminals (a broad-sense electronic component module) according to another embodiment (Third Embodiment) of the present disclosure.

The electronic component (for example, multilayer ceramic capacitor) 50 shown in FIG. 10 is the electronic component 50 with metallic terminals, which is obtained by joining metallic terminals (L-shaped metallic terminals in this example) 53 to external electrodes 52 formed on the surface of an electronic component element 51, with a copper sintered body (joint material) 54 formed by baking the copper particle paste mentioned above.

The electronic component 50 with the metallic terminals according to the Third Embodiment can be prepared easily and reliably, for example, by applying the copper particle paste to the external electrodes 52 formed on the electronic component element 51 or the metallic terminals 53, and applying a heat treatment under a predetermined condition with both the electrodes and terminals joined, thereby providing the sintered copper particles in the copper particle paste.

It is to be noted that the electronic component 50 with the metallic terminals has high reliability, because the external electrodes 52 on the electronic component element 51 and the metallic terminals 53 to be connected are joined reliably with the joint material (copper sintered body) 54 of the high-density copper sintered body of which voids account for a small proportion.

It is to be noted that the metallic terminals are not to be considered limited to the configuration as mentioned above, but may be metallic terminals constituting another part of the electronic component. Also in that case, a similar effect can be achieved. The constituent material of the metallic terminal 53 is not particularly limited, but it is possible to use a material composed of gold, silver, copper, silver-palladium, nickel, or the like.

In addition, the copper particle paste mentioned above is not to be considered limited to the application such as the electronic component modules described in the First and Second Embodiments and the electronic component with the metallic terminals (broad-sense electronic component module) described in the Third Embodiment, but it is also possible to apply the paste to intended uses such as, for example:

(a) a connection material for an integrated component provided within a multilayer ceramic substrate;

(b) a via hole conductor forming material for interlayer connection;

(c) an electrode forming material for forming wirings and electrodes;

(d) a conductive sealing material; and (e) a connection material for die bonding.

The present disclosure is not to be considered limited to the embodiments described above in yet other respects, but various applications and modifications can be made within the scope of the disclosure.

The invention claimed is:

1. An electronic component module comprising:
a structure such that an external terminal included in an electronic component is electrically and mechanically connected to an object to be connected, with a joint material interposed therebetween,
wherein the joint material is formed by making a copper particle paste sintered, the copper particle paste containing:
copper particles having a particle size peak in a range of 0.1 µm to 5.0 µm in a particle size distribution and an average crystallite diameter before sintering in a range of 30 nm to 100 nm, and including, on particle surfaces, no dispersant that suppresses agglomeration; and
an organic compound that achieves a reduction action at a firing temperature for making the copper particles sintered.

2. The electronic component module according to claim 1, wherein the joint material is a copper sintered body with an average crystallite diameter in a range of 60 nm to 150 nm for the sintered copper particles.

3. The electronic component module according to claim 1, wherein the organic compound is an organic compound having a hydroxy group.

4. The electronic component module according to claim 1, wherein the organic compound includes at least one selected from the group consisting of triethanolamine, glycerin, ethylene glycol, triethylene glycol, diethylene glycol, and dipropylene glycol.

5. The electronic component module according to claim 1, wherein the object to be connected is a mounting electrode provided on the circuit board.

6. The electronic component module according to claim 1, wherein the object to be connected is a metallic terminal attached to the external terminal.

7. A method for manufacturing an electronic component module comprising a structure such that an external terminal included in an electronic component is electrically and mechanically connected to an object to be connected, with a joint material interposed therebetween,
the method comprising the steps of:
locating the electronic component and the object to be joined such that the external terminal of the electronic component is opposed to the object to be connected, with a copper particle paste interposed therebetween, the copper particle paste containing copper particles having a particle size peak in a range of 0.1 µm to 5.0 µm in a particle size distribution and an average crystallite diameter before sintering in a range of 30 nm to 100 nm, and including, on particle surfaces, no dispersant that suppresses agglomeration, and an organic compound that achieves a reduction action at a firing temperature for making the copper particles sintered; and
carrying out a heat treatment to cause the copper particles included in the copper particle paste to be sintered, thereby forming a copper sintered body of 60 nm to 150 nm in average crystallite diameter for the copper particles, and thus joining the external terminal of the electronic component and the object to be connected, with the copper sintered body interposed therebetween.

8. The method for manufacturing an electronic component module according to claim 7, wherein the heat treatment is carried out without applying an outside force, with the electronic component disposed on the object to be joined, such that the external terminal of the electronic component is opposed to the object to be connected, with the copper particle paste interposed therebetween.

9. The method for manufacturing an electronic component module according to claim 7, wherein the heat treatment is carried out in an inert atmosphere.

* * * * *